(12) United States Patent
Du et al.

(10) Patent No.: US 9,989,981 B1
(45) Date of Patent: Jun. 5, 2018

(54) CASCADED LDO VOLTAGE REGULATOR

(71) Applicant: Apple Inc., Cupertino, CA (US)

(72) Inventors: Dingkun Du, Santa Clara, CA (US); Jay B. Fletcher, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days. days.

(21) Appl. No.: 15/625,776

(22) Filed: Jun. 16, 2017

(51) Int. Cl.
*G05F 1/595* (2006.01)
*H03F 3/16* (2006.01)
*G05F 1/46* (2006.01)

(52) U.S. Cl.
CPC .............. *G05F 1/595* (2013.01); *G05F 1/461* (2013.01); *H03F 3/16* (2013.01); *H03F 2200/69* (2013.01); *H03F 2200/72* (2013.01); *H03F 2200/75* (2013.01)

(58) Field of Classification Search
None
See application file for complete search history.

(56) References Cited

U.S. PATENT DOCUMENTS

| 5,864,227 A | 1/1999 | Borden |
| 2016/0334818 A1 | 11/2016 | Singh |

OTHER PUBLICATIONS

Leung, et al; "A Capacitor-Free CMOS Low-Dropout Regulator With Damping-Factor-Control Frequency Compensation"; IEEE Journal of Solid-State Circuits, vol. 38, No. 10, Oct. 2003; pp. 1691-1702.

Liu, et al; "Load-Transient Enhanced Low-Dropout Regulator Based on Buffer Stage with Paralleled Current and Voltage Paths for Low-ESR Applications;" IEEE International Conference on Electron Devices and Solid-State Circuits (EDSSC), Chengdu, China, Jun. 18-20, 2014, 2 pages.

*Primary Examiner* — Henry Lee, III
(74) *Attorney, Agent, or Firm* — Meyertons, Hood, Kivlin, Kowert & Goetzel, P.C.

(57) ABSTRACT

A voltage regulator is disclosed. The voltage regulator is cascaded, including first and second stages. The first stage may be a capacitor-less first stage that includes a source follower implemented with a first PMOS transistor, with the first PMOS transistor receiving a first reference voltage on its respective gate terminal. The first stage is coupled to receive a first voltage from an external voltage supply, and to provide a second voltage to the second stage. The second stage may be directly and exclusively coupled to the first stage, with no capacitor or connection for one coupled to the first stage output. The second stage may provide an output voltage, on an output node, with the output voltage being less than the second voltage.

20 Claims, 4 Drawing Sheets

US 9,989,981 B1

CASCADED LDO VOLTAGE REGULATOR

BACKGROUND

Technical Field

This disclosure is directed to electronic circuits, and more particularly, to voltage regulator circuits.

Description of the Related Art

Voltage regulators are commonly used in a wide variety of circuits in order to provide a desired voltage to particular circuits. To this end, a wide variety of voltage regulator circuits are available to suit various applications. Linear voltage regulators are used in a number of different applications in which the available supply voltages exceed an appropriate value for the circuitry to be powered. Accordingly, linear voltage regulators may output a voltage that is less than the received supply voltage.

Some linear voltage regulators may be implemented as stages. Each of the stages may contribute to generating the output voltage based on supplied input voltage (e.g. from the external source). The stages may be coupled to one another, with capacitors coupled to the output of each stage. These capacitors may stabilize the voltage that is output by each of the stages. In voltage regulators implemented on an integrated circuit (IC), the output of a given voltage regulator stage may be provided with an external connection for coupling to a capacitor implemented external to the IC (e.g., on a printed circuit board, or PCB).

SUMMARY

A voltage regulator is disclosed. In one embodiment, the voltage regulator is cascaded, including first and second stages. The first stage may be a capacitor-less first stage that includes a source follower implemented with a first P-type metal-oxide-semiconductor (PMOS) transistor, with the first PMOS transistor receiving a first reference voltage on its respective gate terminal. The first stage is coupled to receive a first voltage from an external voltage supply, and to provide a second voltage to the second stage. The second stage may be directly and exclusively coupled to the first stage, with no capacitor or connection for one coupled to the first stage output, by an intermediate node upon which the second voltage is output. The second stage may provide an output voltage, on an output node, with the output voltage being less than the second voltage.

In one embodiment, in addition to the PMOS-based source follower, the first stage includes a common source amplifier implemented using a PMOS transistor. The first stage may also include a common gate amplifier that is coupled to drive a voltage substantially equal to the second voltage to the gate terminal of the PMOS transistor that implements the common source amplifier. Both the common source amplifier and the source follower are coupled to the intermediate node.

The second stage may, in various embodiments, include an operational amplifier configured to drive the gate of a transistor, and a current mirror implemented using PMOS transistors. The current mirror may mirror the current drawn the transistor coupled to the amplifier output. The second stage may output, on an output node, an output voltage that is less than the second voltage.

Each of the stages may contribute to providing part of the overall power supply rejection ratio (PSRR) for the voltage regulator. The first stage may be more loosely regulated than the second stage.

BRIEF DESCRIPTION OF THE DRAWINGS

The following detailed description makes reference to the accompanying drawings, which are now briefly described.

Figure 1:
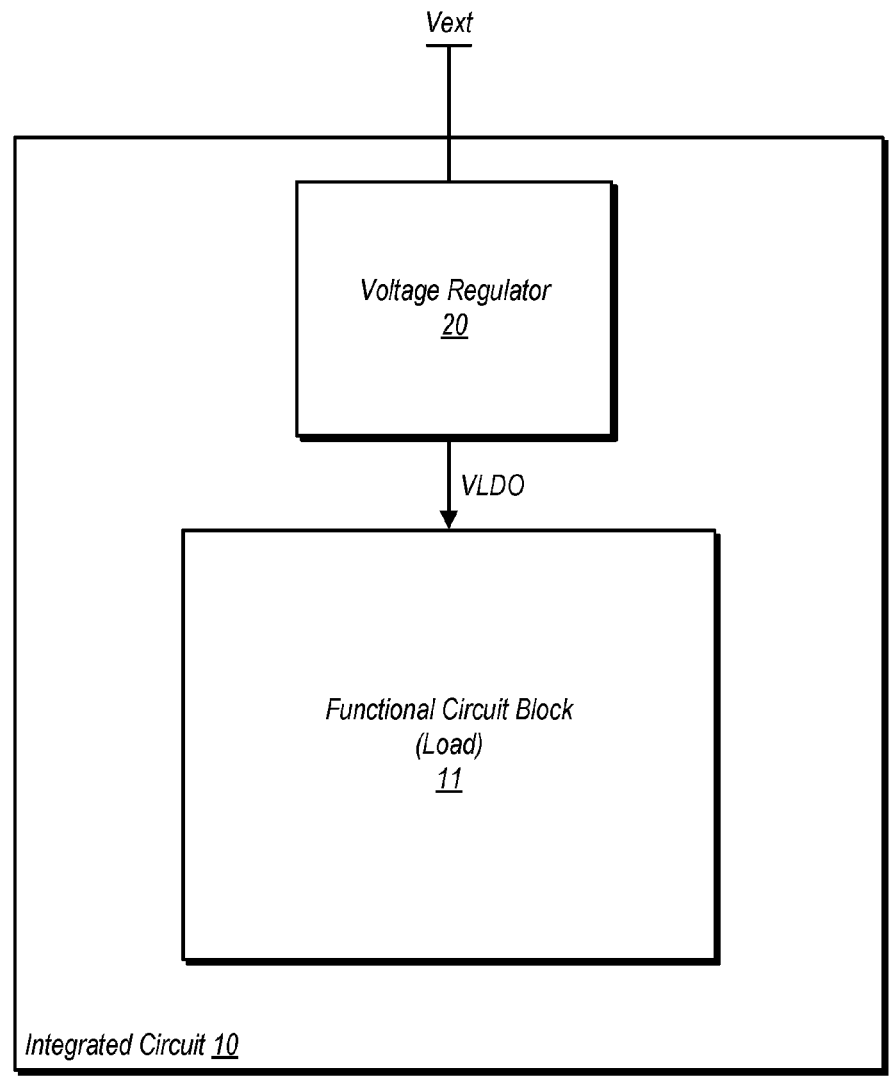
FIG. 1 is a block diagram of one embodiment of an integrated circuit (IC) including a voltage regulator and a functional circuit block.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Turning now to FIG. 1, a simplified block diagram of one embodiment of an integrated circuit (IC) is shown. It is noted that this simplified embodiment is shown for illustrative purposes, but is not intended to be limiting. Furthermore, other types of circuitry (e.g., power management circuitry) may also be implemented on IC 10, and may be coupled to and interact with the circuitry/units shown herein.

IC 10 in the embodiment shown includes a voltage regulator 20 and a functional circuit block 11. The functional circuit block may be one of one or more blocks of circuitry that carry out the various functions of IC 10. In this particular example, functional circuit block 11 is coupled to receive a power via voltage regulator 20. In particular, supply voltage VLDO is provided as a supply voltage to functional circuit block 11, which acts as the load for voltage regulator 20.

In the embodiment shown, voltage regulator 20 receive a supply voltage, Vext, from a source external to IC 10. Embodiments are possible and contemplated in which voltage regulator 20 receives power from another source implemented on IC 10.

Voltage regulator 20, as discussed further below, is a two-stage cascaded linear voltage regulator. Additionally, voltage regulator 20 in the embodiment shown may operate as a series voltage regulator, and more particularly, each of the stages may act as series regulators. The first and second stages may also each share responsibility for providing a part of the overall power supply rejection ratio (PSRR) of the voltage regulator 20 (e.g., the ability to suppress variations in the output voltage, VLDO). In some embodiments, the first stage of voltage regulator 20 may be loosely regulated (e.g., loose voltage tolerance) while the second stage may be more tightly regulated (e.g., tighter voltage tolerances). Furthermore, the first stage may be a capacitor-less first stage, with no connection for a capacitor on its output. Typically, in multi-stage voltage regulators, an external connection for coupling to a capacitor is provided, with the capacitor being implemented external to the IC (e.g., on a printed circuit board, or PCB). However, the first stage of voltage regulator 20 does not include any connection for a capacitor, and provides a voltage directly to the second stage, exclusive of any other circuitry. Accordingly, no extra circuitry path, external pins, or other connections are required, since the intermediate node is exclusively coupled between the first and second stages.

Figure 2:
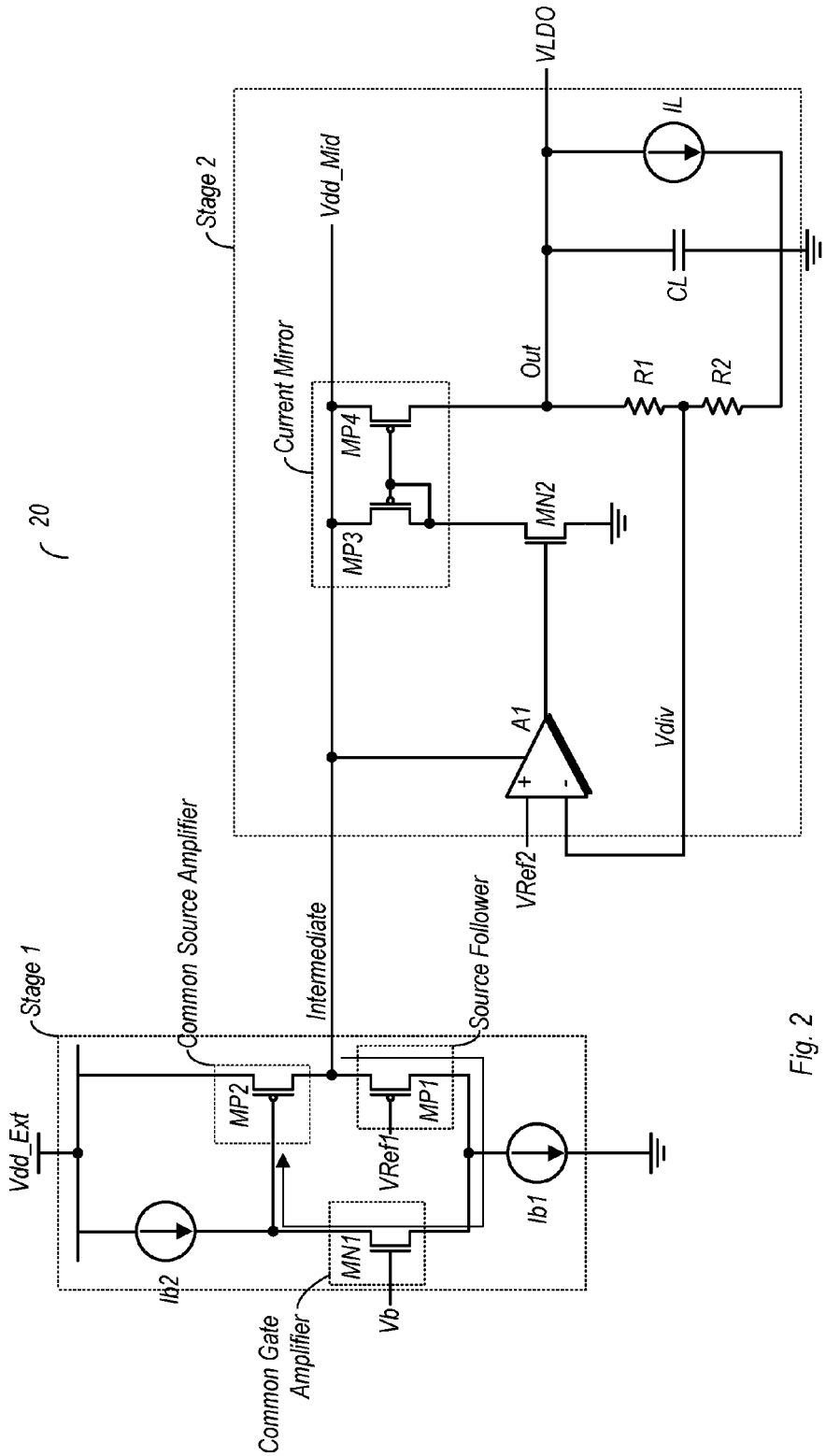
FIG. 2 is a schematic diagram of one embodiment of a voltage regulator.

FIG. 2 is a schematic diagram of one embodiment of voltage regulator 20. In the embodiment shown, voltage regulator 20 includes the two stages as previously mentioned, coupled to one another by an intermediate node as labeled in the drawing. Voltage regulator 20 in the embodiment shown is a low dropout (LDO) regulator.

The first stage ('Stage 1') of voltage regulator 20 in the illustrated embodiment includes a source follower implemented with PMOS transistor MP1, a common source amplifier implemented with PMOS transistor MP2, and a common gate amplifier implemented with NMOS transistor MN1. Transistor MP1 in the embodiment shown is coupled to receive a first reference voltage, VRef1, on its gate terminal. Meanwhile, transistor MN1 in the illustrated embodiment is coupled to receive a bias voltage, Vb, on its gate terminal. The first reference voltage and the bias voltage may both be generated by other voltage generation circuitry (not shown) implemented on IC 10.

In addition to the above, the first stage of voltage regulator 20 includes two bias current sources, Ib1 and Ib2. These current sources may be implemented with any suitable.

During operation, MP2 acts as the previously mentioned common source amplifier, with MP1 as its load. The gate terminal of MP2 is driven in part by MN1, to whose drain terminal it is coupled. More particularly, MP1 and MN1 may effectively transfer the voltage on the intermediate node, Vdd_Mid, to the gate terminal of MP2. MP1 may effectively convert the reference voltage received on its gate terminal (VRef1) to the intermediate voltage, Vdd_Mid, with this voltage (or a value substantially equal thereto) driven to the gate terminal of MP2. Thus, both MP1 and MP2 work in conjunction to drive Vdd_Mid on the intermediate node. Furthermore, considering the operation of MP2, the first stage of voltage regulator 20 may operate as a series regulator. This arrangement may allow for high gain in the first stage of voltage regulator 20.

The use of PMOS transistors as shown in the first stage, as opposed to NMOS transistors, may provide significant advantages. For example, using PMOS transistors in the source follower, as well as in the common source amplifier, may make it easier to meet voltage headroom requirements (e.g., due to the gate and drain voltages required by PMOS devices). Furthermore, the unique combination of the PMOS-based common source amplifier and the PMOS-based source follower may allow the circuit to more efficiently regulate the intermediate voltage (e.g., Vdd_Mid as shown in FIG. 2).

The second stage of voltage regulator 20 includes an amplifier A1, which includes a supply voltage input coupled to receive the intermediate voltage, Vdd_Mid, from the intermediate node. Amplifier A1 is further coupled to receive, on its non-inverting input, a second reference voltage (VRef2, which may be provided from a reference voltage generation circuit that is not shown here). On its inverting input, A1 is coupled to receive a voltage, Vdiv, provided by a voltage divider that includes resistors R1 and R2 and is configured to divide the output voltage, VLDO. Amplifier A1 may drive the gate terminal of MN2 based on the difference between voltages VRef2 and Vdiv. Accordingly, Vdiv provides feedback to amplifier A1, which may drive its output based on a difference between a desired and actual voltage.

The output of amplifier A1 is coupled to the gate terminal of NMOS transistor MN2. Transistor MN2 may draw current through the current mirror that is implemented with PMOS transistors MP3 and MP4. Transistor MP3 is diode-coupled between the intermediate node and the drain terminal of MN2. The current through MP3 and MN2 is mirrored by MP4, whose source-drain path is coupled between the intermediate node and the output node ('Out') upon which the output voltage of voltage regulator 20, VLDO, is provided. The arrangement of MP4 between the intermediate node and the output node results in a series regulator topology for the second stage of voltage regulator 20.

The output voltage from voltage regulator 20 may be provided to a load circuit, such as functional circuit block 11 as shown in FIG. 1. In FIG. 2, the load is represented by capacitor CL and current source IL.

As noted above, each stage of voltage regulator 20 provides a portion of an overall PSRR. Additional critical specifications of voltage regulator 20 may rely mostly on the second stage. These specifications include noise limits, load regulation, and DC accuracy of the output voltage. In general, the second stage may be more tightly regulated than the first with regard to these specifications.

Figure 3:
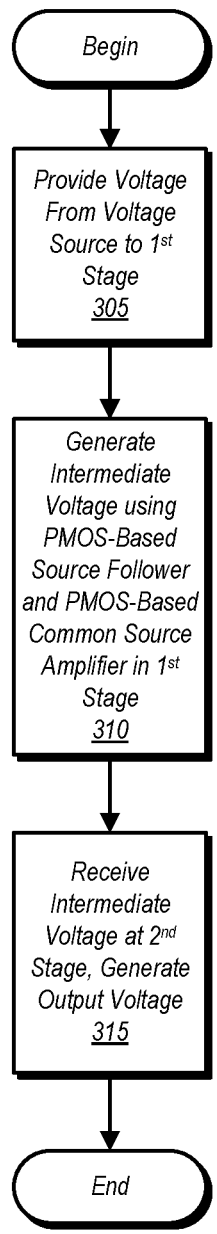
FIG. 3 is a flow diagram illustrating one embodiment of a method for operating a voltage regulator.

FIG. 3 is a flow diagram illustrating one embodiment of a method for operating a voltage regulator. Method 300 may be used with the embodiment of voltage regulator 20 as discussed above. Other embodiments of a voltage regulator may also be capable of performing method 300, and thus may be considered to fall within the scope of this disclosure.

Method 300 begins with the providing of a voltage to a first stage of a voltage regulator (block 305). The voltage regulator may be a two-stage, LDO voltage regulator, with each stage arranged as a series regulator. The voltage may be one that is generated externally. For example, if the voltage regulator is implemented on an IC, the source of the voltage may be other circuitry on the same die (e.g., an on-chip power supply) or external to the IC.

The first stage may generate an intermediate voltage using a PMOS-based source follower and a PMOS-based common source amplifier implemented therein (block 310). The first stage of the voltage regulator may include an arrangement of PMOS devices as shown in FIG. 2 in order to generate the intermediate voltage on an intermediate node coupled between the two devices (as well as to the second stage). The intermediate voltage may be less than the voltage provided from an external source to the first stage. Furthermore, the intermediate node may be exclusively coupled between the first and second stages, with no connection for a capacitor (internal or external to the circuit) provided by this node.

The second stage may receive the intermediate voltage and generate the output voltage for the voltage regulator circuit (block 315). In one embodiment, the second stage may include a PMOS-based current mirror, such as that shown in FIG. 2. However, other second stage embodiments are possible and contemplated. The output voltage provided by the second stage may be less than the intermediate voltage received thereby.

Figure 4:
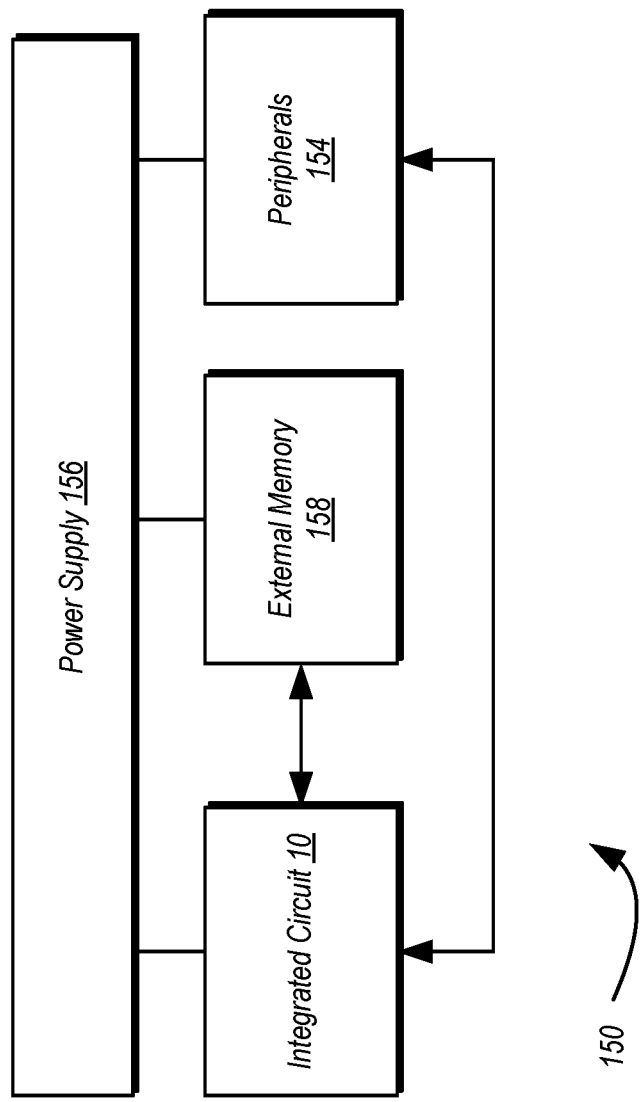
FIG. 4 is a block diagram of one embodiment of an exemplary system.

Turning next to FIG. 4, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit, comprising:
   a voltage regulator, wherein the voltage regulator includes:
   a first stage, wherein the first stage is a capacitor-less first stage and includes a source follower implemented using a first P-type metal-oxide-semiconductor (PMOS transistor), wherein a gate terminal of the first PMOS transistor is coupled to receive a first reference voltage, wherein the first stage is coupled to receive a first voltage from an external voltage supply and is configured to output, on an intermediate node, a second voltage less than the first voltage; and a second stage coupled to receive the second voltage from the first stage, wherein the first stage is configured to directly and exclusively provide the second voltage to the second stage via the intermediate node, wherein the second stage is configured to output a third voltage, on an output node, to a load circuit.

2. The circuit as recited in claim 1, wherein the first stage further comprises a common source amplifier implemented using a second PMOS transistor, wherein the first PMOS transistor comprises a load on the common source amplifier.

3. The circuit as recited in claim 2, further comprising a common gate amplifier implemented using an NMOS transistor that is coupled to both the first and second PMOS transistors, wherein the common gate amplifier is configured to drive a voltage substantially equal to the second voltage to a gate terminal of the second PMOS transistor.

4. The circuit as recited in claim 2, wherein the second stage includes an amplifier having inverting and non-inverting inputs, wherein the non-inverting input of the amplifier is coupled to receive a second reference voltage, and wherein amplifier includes a supply voltage input coupled to receive the second voltage.

5. The circuit as recited in claim 4, wherein an output of the amplifier is coupled to a gate terminal of an NMOS transistor.

6. The circuit as recited in claim 5, further comprising a current mirror coupled to a drain terminal of the NMOS transistor, the current mirror including third and fourth PMOS transistors, wherein respective gate terminals of the third and fourth PMOS transistors are coupled to a drain terminal of the NMOS transistor, and wherein a source terminal of the fourth PMOS transistor is coupled to the output node.

7. The circuit as recited in claim 4, further comprising a voltage divider coupled between the output node and a reference node, wherein the amplifier is coupled to receive a divided voltage from the voltage divider on its inverting input.

8. The circuit as recited in claim 1, wherein the first stage comprises a first series voltage regulator, and wherein the second stage comprises a second series voltage regulator.

9. A method comprising:
receiving, at a first stage of a voltage regulator, a first voltage;
providing, from the first stage, a second voltage that is less than the first voltage, wherein the first stage is capacitor-less and comprises a source follower implemented using a first P-type metal-oxide-semiconductor (PMOS) transistor and a common source amplifier implemented using a second PMOS transistor;
receiving, at a second stage of the voltage regulator, the second voltage, wherein the first stage is coupled to provide the second voltage directly and exclusively to the second stage via an intermediate node; and
providing a third voltage on an output node of the second stage of the voltage regulator, the third voltage being less than the second voltage.

10. The method as recited in claim 9, further comprising the source follower acting as a load on the common source amplifier.

11. The method as recited in claim 9, further comprising a common gate amplifier coupled to the source follower and the common source amplifier, wherein common gate amplifier is implemented using a first NMOS transistor, and wherein the common gate amplifier is configured to drive a voltage substantially equal to the second voltage to a gate terminal of the second PMOS transistor.

12. The method as recited in claim 11, further comprising:
providing a first reference voltage to a gate terminal of the first PMOS transistor; and
providing a bias voltage to a gate terminal of the first NMOS transistor.

13. The method as recited in claim 12, further comprising:
providing the second voltage to a supply voltage input of an amplifier in the second stage, the amplifier having inverting and non-inverting inputs;
providing a second reference voltage to the non-inverting input of the amplifier;
the amplifier driving an output voltage onto a gate terminal of a second NMOS transistor.

14. The method as recited in claim 13, further comprising:
the second NMOS transistor providing a current source to a current mirror circuit, the current mirror circuit comprising third and fourth PMOS transistors;
outputting the third voltage on the output node, the output node being coupled to a drain terminal of the fourth PMOS transistor; and
providing a divided voltage from a voltage divider to the inverting input of the amplifier, the voltage divider being coupled to the output node.

15. A voltage regulator comprising:
a first stage, wherein the first stage includes a source follower implemented using a first P-type metal-oxide-semiconductor (PMOS) transistor and a common source amplifier implemented using a second PMOS transistor, wherein the first and second PMOS transistors are each coupled to an intermediate node, wherein the first stage is a capacitor-less first stage; and
a second stage, wherein the first stage is configured to directly and exclusively provide an intermediate voltage to the second stage via the intermediate node, wherein the second stage is configured to provide an output voltage, on an output node, to a load circuit.

16. The voltage regulator as recited in claim 15, wherein the first stage is coupled to receive a supply voltage from a voltage source external to the voltage regulator, wherein the second stage is configured to receive, on the intermediate node, the intermediate voltage at a value that is less than the supply voltage, and wherein the second stage is configured to provide the output voltage at a value that is less than the intermediate voltage.

17. The voltage regulator as recited in claim 15, wherein the first stage further comprises a common gate amplifier coupled to drive, to a gate terminal of the second PMOS transistor, a voltage that is substantially a same value as the intermediate voltage.

18. The voltage regulator as recited in claim 15, wherein the second stage comprises an operational amplifier having a supply voltage input coupled to receive the intermediate voltage from the intermediate node.

19. The voltage regulator as recited in claim 15, wherein the second stage comprises a current mirror circuit including a third PMOS transistor and a fourth PMOS transistor, wherein each of the third and fourth PMOS transistors have respective source terminals coupled to the intermediate node, and wherein a drain terminal of the fourth PMOS transistor is coupled to the output node.

20. The voltage regulator as recited in claim 15, wherein the voltage regulator implements a low-dropout (LDO) voltage regulator, wherein the first stage comprises a first series regulator and the second stage comprises a second series regulator.

\* \* \* \* \*